(12) United States Patent
DeVilbiss et al.

(10) Patent No.: US 10,978,127 B2
(45) Date of Patent: Apr. 13, 2021

(54) FERROELECTRIC RANDOM ACCESS MEMORY SENSING SCHEME

(71) Applicant: Cypress Semiconductor Corporation, San Jose, CA (US)

(72) Inventors: Alan D. DeVilbiss, Colorado Springs, CO (US); Jonathan Lachman, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/784,712

(22) Filed: Feb. 7, 2020

(65) Prior Publication Data

US 2020/0258561 A1 Aug. 13, 2020

Related U.S. Application Data

(63) Continuation of application No. 16/111,521, filed on Aug. 24, 2018, now Pat. No. 10,586,583.

(Continued)

(51) Int. Cl.
*G11C 11/22* (2006.01)
*G11C 7/06* (2006.01)
*G11C 7/08* (2006.01)

(52) U.S. Cl.
CPC ............ *G11C 11/2273* (2013.01); *G11C 7/06* (2013.01); *G11C 7/062* (2013.01); *G11C 7/067* (2013.01);

(Continued)

(58) Field of Classification Search
CPC ......... G11C 11/22; G11C 7/06; G11C 11/221; G11C 11/2259; G11C 11/2273
See application file for complete search history.

(56) References Cited

U.S. PATENT DOCUMENTS 5,267,214 A 11/1993 Fujishima et al.
5,404,327 A 4/1995 Houston
(Continued)

FOREIGN PATENT DOCUMENTS

CN 1643611 A 7/2005
CN 103578534 A 2/2014
(Continued)

OTHER PUBLICATIONS

Choi, Mun-kyu, "A Novel Sensing Scheme for High-Speed and High Density Ferroelectric RAM" Journal of the Korean Physical Society, vol. 40, No. 6, Apr. 2002, pp. 697-700; 4 pages.

(Continued)

*Primary Examiner* — Vanthu T Nguyen

(57) ABSTRACT

Semiconductor memory devices and methods of operating the same are provided. The method of operation may include the steps of selecting a ferroelectric memory cell for a read operation, coupling a first pulse signal to interrogate the selected ferroelectric memory cell, the selected ferroelectric memory cell outputting a memory signal to a bit-line in response to the first pulse signal, coupling the memory signal to a first input of a sense amplifier via the bit-line, electrically isolating the sense amplifier from the selected ferroelectric memory cell, and enabling the sense amplifier for sensing after the sense amplifier is electrically isolated from the selected ferroelectric memory cell. Other embodiments are also disclosed.

18 Claims, 12 Drawing Sheets

Related U.S. Application Data

(60) Provisional application No. 62/640,489, filed on Mar. 8, 2018.

(52) U.S. Cl.
CPC .............. *G11C 7/08* (2013.01); *G11C 11/22* (2013.01); *G11C 11/221* (2013.01); *G11C 11/2255* (2013.01); *G11C 11/2259* (2013.01); *G11C 2207/002* (2013.01)

(56) References Cited

U.S. PATENT DOCUMENTS

| | | | |
|---|---|---|---|
| 5,995,406 | A | 11/1999 | Kraus et al. |
| 6,002,634 | A | 12/1999 | Wilson |
| 6,028,783 | A | 2/2000 | Allen et al. |
| 6,094,379 | A | 7/2000 | Sago |
| 6,118,688 | A | 9/2000 | Hirano et al. |
| 6,453,433 | B1 | 9/2002 | Vollrath |
| 6,480,410 | B2 | 11/2002 | Kang et al. |
| 6,483,738 | B2 | 11/2002 | Kang et al. |
| 6,542,431 | B2 | 4/2003 | Nakagawa |
| 6,658,608 | B1 | 12/2003 | Kamp et al. |
| 6,912,149 | B2 | 6/2005 | Yamaoka et al. |
| 7,164,594 | B2 | 1/2007 | Kang et al. |
| 7,561,459 | B2 | 7/2009 | Shiga et al. |
| 8,085,574 | B2 | 12/2011 | Kang |
| 8,203,895 | B2 | 6/2012 | Lee et al. |
| 9,019,784 | B2 | 4/2015 | Park et al. |
| 9,514,816 | B1 | 12/2016 | Ashokkumar et al. |
| 9,899,073 | B2 * | 2/2018 | Kawamura ............ G11C 11/221 |
| 2016/0365145 | A1 | 12/2016 | Ashokkumar et al. |

FOREIGN PATENT DOCUMENTS

| | | |
|---|---|---|
| JP | 6147461 B1 | 6/2017 |
| WO | 2017205007 A1 | 11/2017 |

OTHER PUBLICATIONS

International Search Report for International Application No. PCT/US19/18183 dated Mar. 18, 2019; 2 pages.
USPTO Advisory Action for U.S. Appl. No. 16/111,521 dated Apr. 22, 2019; 2 pages.
USPTO Final Rejection for U.S. Appl. No. 16/111,521 dated Mar. 4, 2019; 11 pages.
USPTO Non-Final Rejection for U.S. Appl. No. 16/111,521 dated Jun. 7, 2019; 12 pages.
USPTO Non-Final Rejection for U.S. Appl. No. 16/111,521 dated Oct. 25, 2018; 11 pages.
USPTO Notice of Allowance for U.S. Appl. No. 16/111,521 dated Oct. 10, 2019; 5 pages.
USPTO Notice of Allowance for U.S. Appl. No. 16/111,521 dated Nov. 21, 2019; 5 pages.
Witten Opinion of the International Searching Authority for International Application No. PCT/USI9/18183 dated Mar. 18, 2019; 6 pages.
SIPO Office Action for Application No. 201980016283.X dated Dec. 3, 2020; 6 pages.

* cited by examiner

FERROELECTRIC RANDOM ACCESS MEMORY SENSING SCHEME

PRIORITY

This application is a Continuation of U.S. patent application Ser. No. 16/111,521, filed Aug. 24, 2018, which claims the benefit of U.S. Provisional Application No. 62/640,489, filed on Mar. 8, 2018, which are incorporated by reference herein in their entirety.

TECHNICAL FIELD

The present disclosure relates generally to a non-volatile (NV) memory device, and more particularly, to signal sensing scheme for a ferroelectric random access memory (F-RAM) device.

BACKGROUND

Memory that retains its data even when operation power is not available is classified as nonvolatile memory. Examples of non-volatile memory are nvSRAM, F-RAM, electrically erasable programmable read-only memory (EEPROM), and flash memories. This class of memory may be used in applications in which critical data must be stored after power is removed, or when power is interrupted during operation.

Reference voltage for a memory device or cell may be interpreted as a voltage level that separates what is to be considered a data value "0" or a "1" stored, depending on the charge stored/generated in the memory device or cell. In certain embodiments, voltages found on the memory bus below the reference voltage are to be considered a "0" and voltages above the reference voltage are to be considered a "1", or vice versa. Depending on the system requirements or design preferences, the reference voltage may be kept at a constant level, programmable, or a combination thereof. In some embodiments, no reference voltage/signal will be used. Instead, complementary memory cells (true bit and complementary bit) will be compared to one another to determine the binary state of the true memory cell.

To achieve an accurate and reliable read, it is important to maintain sensing devices, such as sense amplifiers, to be as balanced and symmetrical as possible during the read operation.

BRIEF DESCRIPTION OF THE DRAWINGS

The present disclosure is illustrated by way of example, and not by way of limitation, in the FIGS. of the accompanying drawings.

DETAILED DESCRIPTION

Figure 1A:
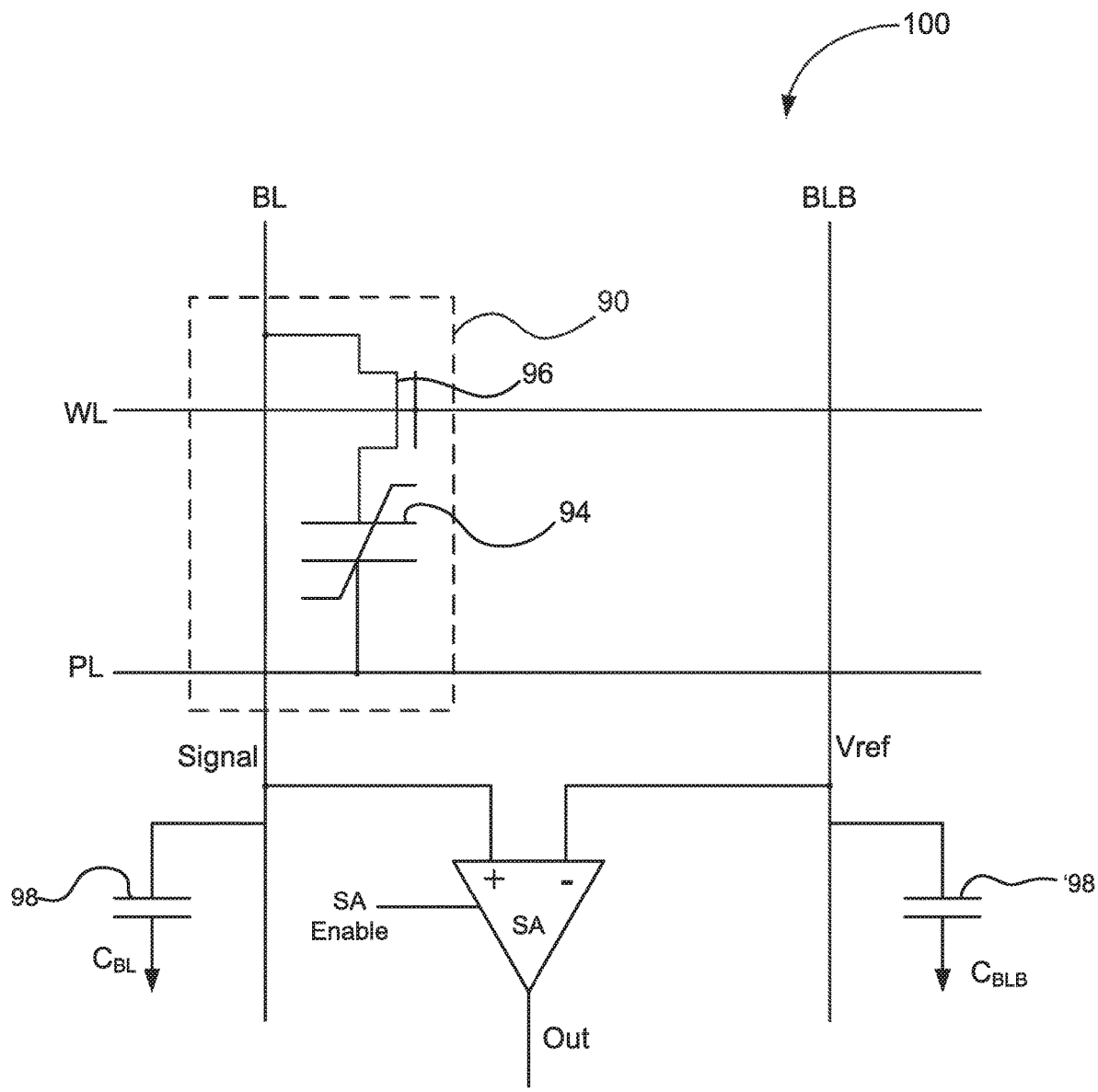
FIG. 1A is a schematic diagram illustrating a one-transistor one-capacitor (1T1C) memory cell in accordance with one embodiment of the subject matter.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

It is a common practice for computers and other processing devices to store information or programs which have been developed or updated in NV memory, such as flash memory, EEPROM, F-RAM, so that in the event of a power outage or a mistake, data can be retrieved.

Summary of Embodiments

According to one embodiment of a method of operating a non-volatile memory device, the method may include the steps of selecting a ferroelectric memory cell for a read operation, coupling a first pulse signal to interrogate the selected ferroelectric memory cell, the selected ferroelectric memory cell outputting a memory signal to a bit-line in response to the first pulse signal, coupling the memory signal to a first input of a sense amplifier via the bit-line, electrically isolating the sense amplifier from the selected ferroelectric memory cell, and enabling the sense amplifier for sensing after the sense amplifier is electrically isolated from the selected ferroelectric memory cell.

In one embodiment, the method may further include the step of coupling a reference signal to a second input of the sense amplifier.

In another embodiment, the method may further include the steps of coupling a second pulse signal to interrogate a complementary ferroelectric memory cell, the complementary ferroelectric memory cell outputting a complementary signal to a bit-line-bar in response to the second pulse signal, coupling the complementary signal to a second input of the sense amplifier via the bit-line-bar. The step of enabling the sense amplifier for sensing may be performed after the sense amplifier is electrically isolated from the complementary ferroelectric memory cell.

In one embodiment, the step of electrically isolating the sense amplifier may be performed locally within the selected ferroelectric memory cell by de-asserting a first word-line signal coupling to a gate of a pass transistor of the selected ferroelectric memory cell. The electrical isolation between the sense amplifier and the complementary ferroelectric memory cell may be performed by de-asserting a second word-line signal coupling to a gate of a pass transistor of the complementary ferroelectric memory cell.

In one embodiment, the selected ferroelectric memory cell has a one-transistor-one-capacitor (1T1C) configuration.

In one embodiment, the first and second pulse signals may be singular square pulse signals having low and high amplitudes of Vss and $V_{DD}$, respectively.

In certain embodiments, the step of electrically isolating the sense amplifier from the selected ferroelectric memory cell may be performed along the bit-line using a transistor.

In one embodiment, the step of electrically isolating the sense amplifier from the selected ferroelectric memory cell may be performed after the first pulse signal is de-asserted.

According to one embodiment of a memory device, the memory device may include a first memory cell including a first ferroelectric capacitor coupling to a first pass transistor, a first plate line coupling to one of two plates of the first ferroelectric capacitor, a first bit-line coupling the first pass transistor to a sense amplifier, a first word-line coupling to a gate of the first pass transistor, wherein during a read operation of the first memory cell, a first word-line signal on the first word-line is de-asserted before the sense amplifier is enabled for a sense operation.

In one embodiment, the first memory cell may have a one-transistor-one-capacitor (1T1C) configuration, and wherein the sense operation of the sense amplifier compares an amplitude of a memory signal outputted from the first memory cell to a reference signal.

In one embodiment, the memory device may also include a second memory cell including a second ferroelectric capacitor coupling to a second pass transistor, wherein the first and second memory cells form a complementary memory cell having a two-transistor-two-capacitor (2T2C) configuration, a second plate line coupling to one of two plates of the second ferroelectric capacitor, a second bit-line coupling the second pass transistor to the sense amplifier, a second word-line coupling to a gate of the second pass transistor. During the read operation of the first memory cell, a second word-line signal on the second word-line may be de-asserted before the sense amplifier is enabled for the sense operation.

In one embodiment, the sense operation of the sense amplifier may compare an amplitude of a memory signal outputted from the first memory cell to a complementary signal outputted from the second memory cell.

In one embodiment, during the read operation of the first memory cell, a square pulse signal is asserted on the first plate line to interrogate the first ferroelectric capacitor, and wherein the word-line signal on the first word-line may be de-asserted after the square pulse signal on the first plate line is de-asserted.

According to one embodiment of a method for operating a ferroelectric memory array, the method may include the steps of coupling a first plate line to the ferroelectric memory array, wherein the first plate line is associated with a first column, and the first plate line may be coupled to a square pulse signal during a read operation of a selected memory cell, coupling a first word-line to the ferroelectric memory array, wherein the first word-line is associated with a first row of memory cells and the first word-line may be coupled to a word-line signal, coupling a first bit-line to the ferroelectric memory array, wherein the first bit-line is associated with the first column and may electrically connect the selected memory cell to a sense amplifier when the word-line signal is asserted, de-asserting the square pulse signal, de-asserting the word-line signal, and subsequent to the word-line signal being de-asserted, coupling an enable signal to the sense amplifier to start a sense operation.

In one embodiment, the word-line signal may be de-asserted subsequent to the square pulse signal being de-asserted.

In one embodiment, the ferroelectric memory array may be formed by arranging one-transistor-one-capacitor (1T1C) ferroelectric memory cells in rows and column.

In one embodiment, two adjacent 1T1C ferroelectric memory cells of the same row may form one two-transistor-two-capacitor (2T2C) complementary memory cell.

In one embodiment, during the read operation, in response to the square pulse signal, the selected memory cell may output a memory signal, and wherein the sense amplifier may compare an amplitude of the memory signal to a reference signal to determine a binary state of the selected memory cell.

Embodiments of ferroelectric capacitor based memory devices, and methods of operating the same, which allow maintenance of optimal balance and symmetry of sensing devices, will now be described with reference to the accompanying drawings. The drawings described are only schematic and are non-limiting. In the drawings, the size of some of the elements may be exaggerated and not drawn to scale for illustrative purposes. The dimensions and the relative dimensions may not correspond to actual reductions to practice of the subject matter. For purposes of clarity, many details of input devices and methods of operation in general, and in particular, which are widely known and not essential to the present apparatus and method have been omitted from the following description.

FIG. 1A is a schematic diagram illustrating a one-transistor one-capacitor (1T1C) ferroelectric random access memory (F-RAM) sensing circuit 100 in accordance with one embodiment of the subject matter. In one embodiment, the 1T1C F-RAM sensing circuit may include a non-volatile memory element, such as ferroelectric capacitor 94 and an n-channel or p-channel pass field-effect transistor (pass transistor) 96 to form a single memory or F-RAM cell 90. The 1T1C F-RAM sensing circuit may further include bit-line (BL), bit-line-bar (BLB), bit-line capacitor 98 and BLB capacitor '98 which may be a metal-oxide-semiconductor (MOS) capacitor or simply parasitic capacitance, and sense amplifier (SA). F-RAM ferroelectric capacitor 94 may include a structure of a ferroelectric layer, such as lead zirconate titanate (PZT material), disposed between two conducting plates, or other similar embodiments known in the art. In one embodiment, one plate of F-RAM ferroelectric capacitor 94 may be coupled to plate line (PL) and the other plate may be coupled to BL via the source-drain path of pass transistor 96. The gate of pass transistor 96 may be coupled to word-line (WL) and configured to be controlled (on or off) by the word-line signal. Ferroelectric capacitors, such as F-RAM ferroelectric capacitor 94, may demonstrate a spontaneous non-zero polarization even when the applied electric field is zero. This distinguishing feature signifies that spontaneous polarization may be reversed or flipped by a suitably strong electric field applied in an opposite direction. The polarization is therefore dependent not only on the currently applied electric field, but also on the current polarity of the ferroelectric capacitor.

In one embodiment, reading and writing operations of F-RAM cell 90 are executed by manipulating the plate line signal, bit-line signal, and/or word-line signal. Consequently, the state of polarity, which represents data value "0" or "1" of F-RAM ferroelectric capacitor 94, may be flipped, maintained, and output according to the stored data value. In certain embodiments, multiple 1T1C F-RAM cells 90 may be arranged in an F-RAM array (not shown in this figure) and each 1T1C F-RAM cell 90 of a same row or column may share a common plate line, bit-line, and/or word-line. In one embodiment, charge generated in F-RAM ferroelectric capacitor 94 during a read operation is output to a sense amplifier (SA) via pass transistor 96 and BL to determine whether data stored represents data "0" or "1". It should, however, be appreciated that other types of transistors, such as p-channel FETs, and combinations of different types of transistors, capacitors, resistors may be utilized in some embodiments of the F-RAM cells.

Non-switching term (U term or U term signal) is the charge generated on F-RAM ferroelectric capacitor 94 when there is no switching of polarization involved after a voltage or electric field is applied thereon. Switching term (P term or P term signal) is the charge generated when there is a switching of polarization. In a 1T1C configuration, U term may represent data "0" and P term may represent data "1", or vice versa in some embodiments. In the subsequent sections, magnitude of U, P term signals may be expressed and compared to other signals in voltage terms.

Figure 1B:
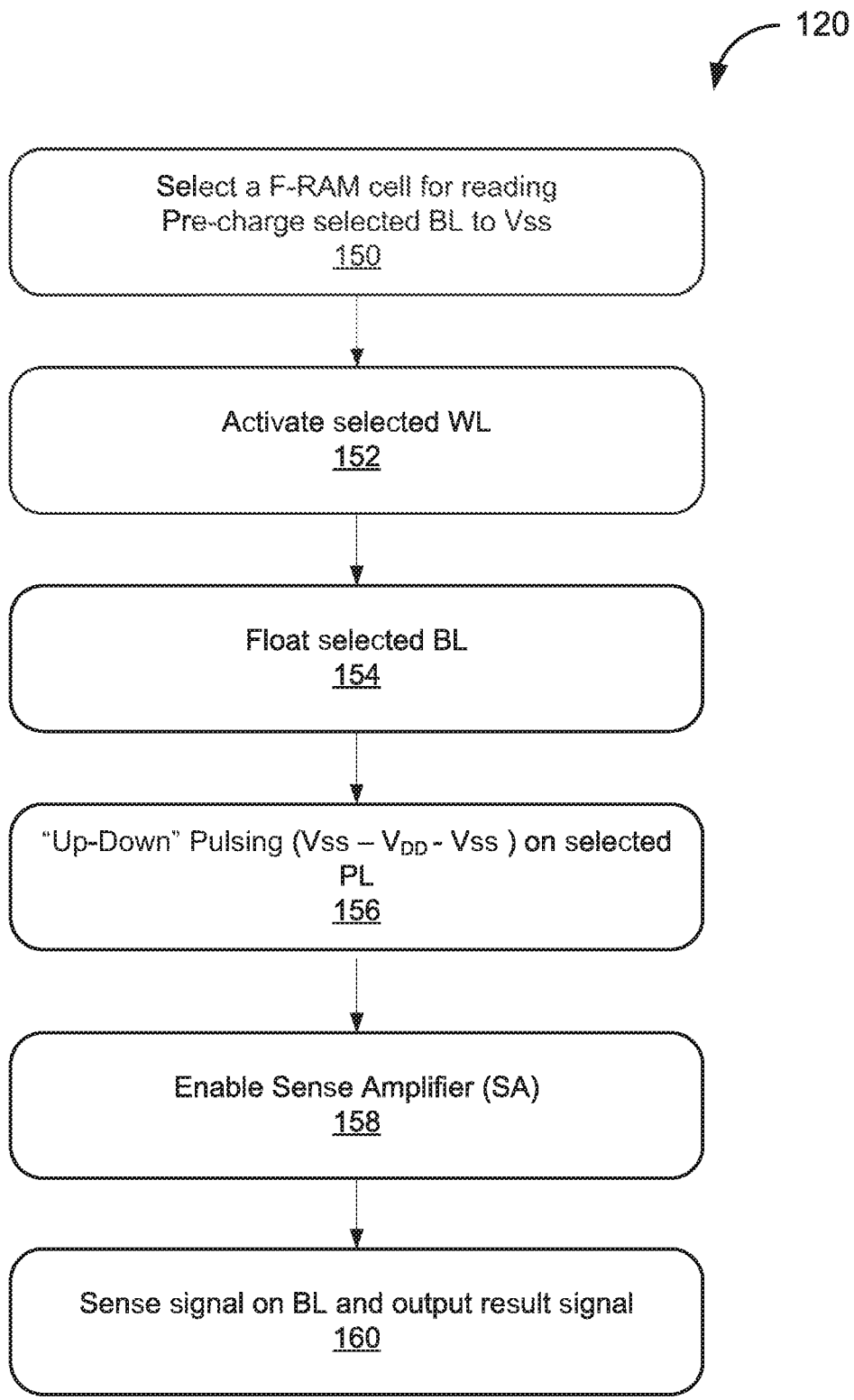
FIG. 1B is a representative flowchart for an operation method of an F-RAM during a read operation in accordance with one embodiment of the subject matter.

Referring to the flowchart in FIG. 1B, a reading operation 120 of a memory cell, such as F-RAM cell 90, starts with a selection of a particular or multiple cells for the read, in step 150. In one embodiment, BL associated with the selected memory cell 90 is pre-charged to Vss. Then WL associated with the selected memory cell 90 is activated, turning on pass transistor 96, in step 152. BL is subsequently floated, in step 154.

Plate line, coupled to one of the plates in ferroelectric capacitor 94, is pulsed with "up-down" pulse. In one embodiment, an "up-down" pulse or a square pulse signal includes turning the PL signal from Vss to $V_{DD}$ (operation voltage), and then back to Vss. The PL pulse interrogates F-RAM cell 90 by either flipping or maintaining the polarization state of ferroelectric capacitor 94. In response, ferroelectric capacitor 94 may output a P term or a U term signal. The 1T1C F-RAM architecture, which may include only one ferroelectric capacitor, may utilize the P term and U term of the same ferroelectric capacitor 94 in the 1T1C F-RAM cell to represent stored data. Therefore, a 1T1C F-RAM cell may be considered single ended. The P or U term signal from ferroelectric capacitor 94 is outputted to sense amplifier (SA) via BL.

Figure 3:
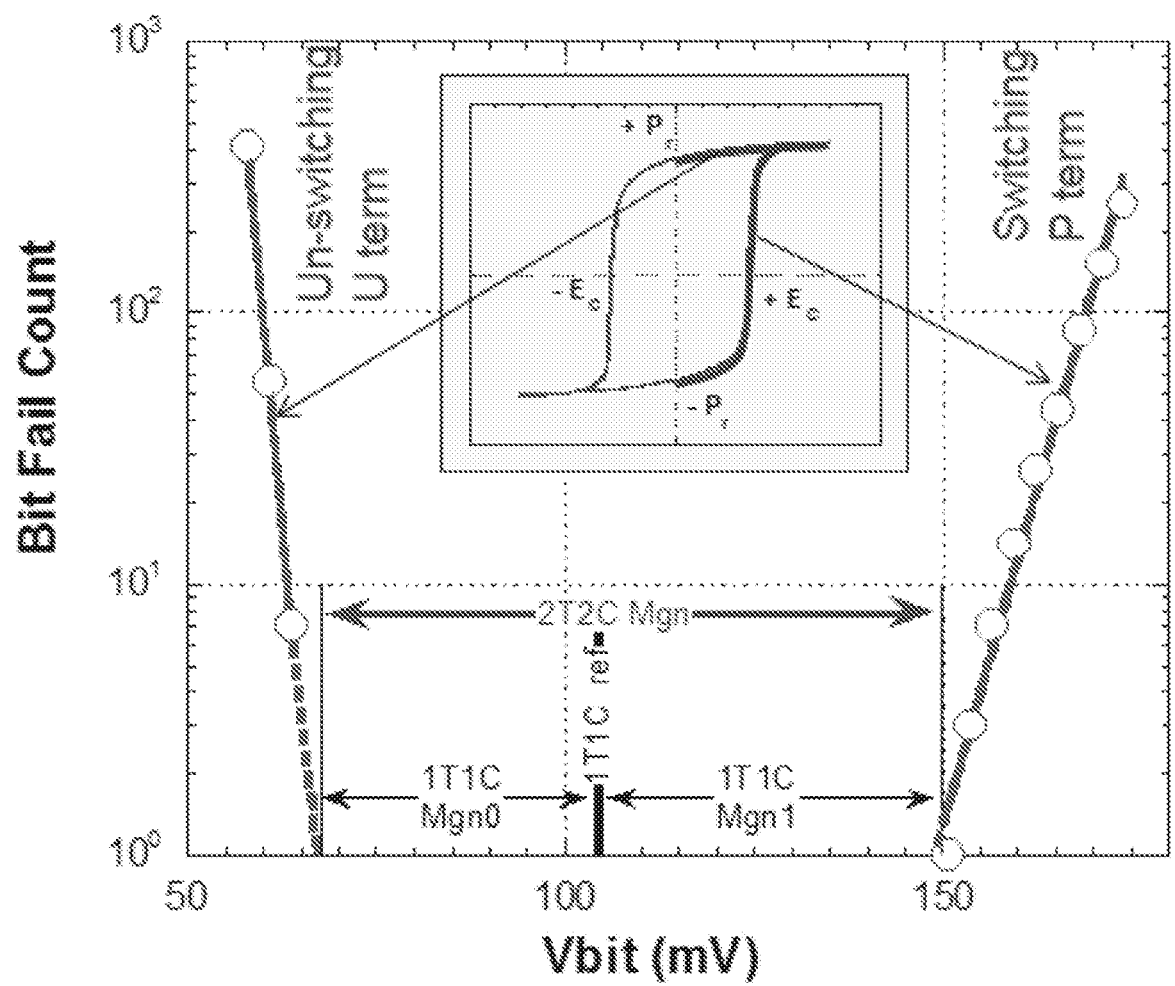
FIG. 3 is a diagram illustrating relationship between F-RAM switching term (P term) and non-switching term (U term), and bit fail count (F-RAM bit distribution)

SA is then enabled by activating SA_enable signal, in step 158. As illustrated in FIG. 1A, memory signal (P or U term) of ferroelectric capacitor 94 is coupled to one input of SA, and a reference signal (Vref) is coupled to another input of SA via bit-line-bar (BLB). A reference signal or voltage is a voltage generated internally in an F-RAM device or externally as a reference to differentiate the P term and the U term of ferroelectric capacitors, which in turn represent data "1" and "0" respectively. Since 1T1C F-RAM utilizes the P term and the U term of the same ferroelectric capacitor, a reference voltage may be required to differentiate the two signals. In one embodiment, as illustrated in FIG. 3, a reference voltage is generated within a range between the U term signal and P term signal. Mgn0 is defined as the 1T1C signal margin for data "0", which may be the voltage difference between the reference voltage and U term signal. Mgn1 is defined as the 1T1C signal margin for data "1", which is the voltage difference between P term signal and the reference voltage. It will be the understanding that P term and U term may be reversed to represent "0" and "1" respectively in some embodiments. The 1T1C reference voltage divides the total ferroelectric switching charge into two components or portions, the signal margin for data "0" (Mgn0) and the signal margin for data "1" (Mgn1).

After the memory signal is compared to the Vref, the SA will output the result, in step 160. In one embodiment, if the memory signal is greater than Vref, it will be considered the P-term ("0" or "1"). If the memory signal is less than Vref, it will be considered the U-term ("1" or "0").

Figure 2:
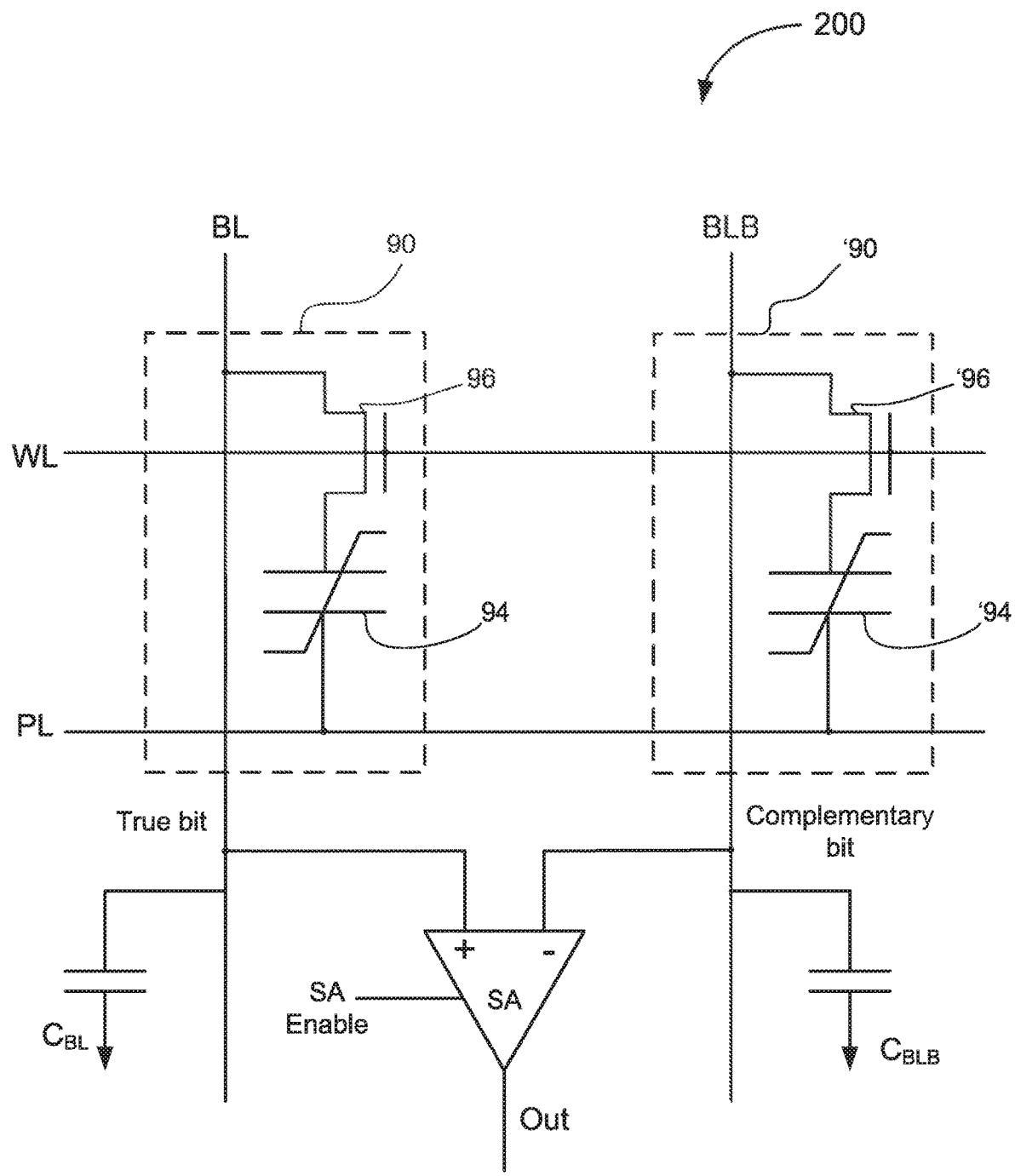
FIG. 2 is a schematic diagram illustrating a two-transistor two-capacitor (2T2C) memory cell in accordance with one embodiment of the subject matter.

FIG. 2 is a schematic diagram illustrating two-transistor two-capacitor (2T2C) ferroelectric random access memory (F-RAM) sensing circuit 200 in accordance with one embodiment of the subject matter. In one embodiment, F-RAM cells 90 and '90 are configured as complementary memory cells. When F-RAM cell 90 is programmed to one particular polarization state ("0" for example), F-RAM cell '90 is programmed to the opposite polarization state ("1" for example). Pass transistors 96 and '96 may be coupled to the same WL, as illustrated in FIG. 2. Alternatively, pass transistors 96 and '96 are coupled to two different WLs and controlled by two different WL signals. Similarly, ferroelectric capacitors 94 and '94 may be coupled to the same PL or two different PLs, according to design requirements. In one embodiment, pass transistor '96 is coupled to BLB, and no Vref may be required for the read operation.

Read operation of 2T2C F-RAM sensing circuit 200 is similar to the 1T1C, as illustrated in FIG. 1B. During a read operation, F-RAM cells 90 and '90 may be interrogated simultaneously or separately by "Up-Down" pulse asserted on PL (either one PL or two separate PLs), as in step 156 of FIG. 1B. The signal output from F-RAM cell 90 may be considered the true signal or bit, and the signal output from F-RAM cell '90 may be considered the complementary signal or bit. As explained above, true signal and complementary signal are opposite by design.

Compared with the 2T2C design, the 1T1C design may include only a maximum of half of the signal margin if the reference voltage is configured perfectly at a half way voltage between P term and U term signals. Therefore, the smaller cell size of 1T1C design may be at the expense of available signal margin.

In contrast, the 2T2C F-RAM architecture which includes two ferroelectric capacitors, may utilize the P term of one ferroelectric capacitor and the U term of the other ferroelectric capacitor in the same 2T2C F-RAM cell to represent stored data. In one embodiment, 2T2C F-RAM cells may lead to a signal margin that benefits from the full ferroelectric capacitor switching charge (i.e. P term-U term), making the 2T2C F-RAM cell differential. However, a 1T1C F-RAM cell or array, compared to the 2T2C design, may have the advantage of a smaller cell size.

To ensure a reliable read, whether it is a single-ended read (e.g. 1T1C) or a differential read (e.g. 2T2C), it is of critical importance that the sense amplifier is as balanced and symmetrical as possible. Any asymmetry in the sense amplifier may result in an input offset voltage that will directly detract from the sensing margin. In one embodiment, symmetry and balance of the sense amplifier may be achieved through proper layout techniques. For example, bitlines (e.g. BL and BLB in FIGS. 1A and 2) may be very carefully matched to each other through layout techniques to ensure that the sense amplifier is balanced and as little systematic input offset as possible. In certain embodiments, small trimming capacitors may be selectively added to one input of the sense amplifier to try to add balance and symmetry. Despite the best efforts, manufacturing process of the ferroelectric capacitors may not be controlled completely. As a result, the effective area, thickness, and other parameters of the ferroelectric capacitors may vary significantly. In one embodiment, the variable electrical impedance, such as linear capacitance, of the ferroelectric capacitors may also adversely affect the balance and symmetry of the sense amplifier while electrically connected to it.

The read operation of F-RAM memory cells is destructive, meaning that the data must be refreshed after the read operation is accomplished. Referring to FIG. 1B, stored data is destroyed by the interrogation pulse (e.g. up-down pulse) in step 156. Therefore, ferroelectric capacitors 94 and/or '94 adds no valuable information to the circuit or read operation after the up-down pulsing of the PL(s). Referring to FIGS. 1A and 1B, WL is brought high (step 152) before PL is pulsed (step 156). If WL remains high to turn on pass transistor 96 after the interrogation of ferroelectric capacitor 94 and memory signal output is completed, ferroelectric capacitor 94 will remain electrically connected to the sense amplifier input through the pass transistor 96. If WL is kept high while the sense amplifier is enabled (step 158), ferroelectric capacitor remains electrically connected to the sense amplifier during the sensing operation. As previously explained, the electrical connection between ferroelectric capacitor 94 and SA during sensing does not add any valuable information since the stored value was already destroyed during the PL pulse (step 156). The connection may however contribute a significant amount of asymmetry to the sense amplifier causing the sense amplifier's input offset to increase and the sensing margin to decrease.

Figure 4:
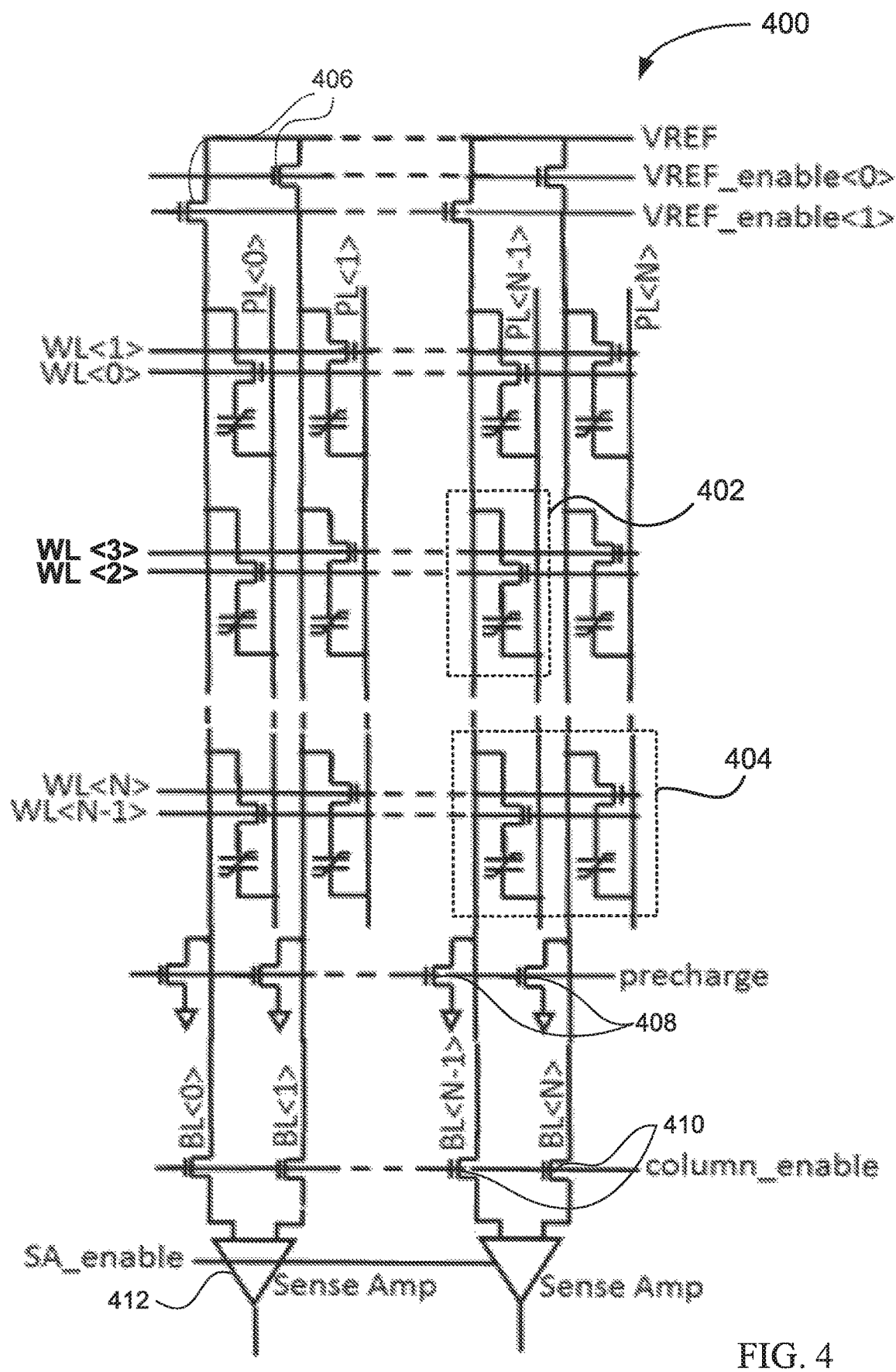
FIG. 4 is a schematic diagram illustrating a portion of an F-RAM device in accordance with one embodiment of the subject matter.

FIG. 4 is a schematic diagram illustrating a portion of an F-RAM device 400. In one embodiment, F-RAM device 400 will be used herein to illustrate how WL signals may be configured during a read operation to improve balance and symmetry of SA. It will be the understanding that the disclosed method may be applicable to other similar memory devices known in the art.

Referring to FIG. 4, multiple 1T1C memory cells 402 may be arranged in rows and columns to form an F-RAM memory array. 1T1C memory cells 402 may have a similar configuration and structure as illustrated in FIG. 1A. As best illustrated in FIG. 4, multiple 1T1C memory cells 402 are arranged in N+1 rows (row 0 to row N) and N+1 columns (col. 0 to col. N). In one embodiment, 1T1C memory cells in the same column share and electrically coupled to one plate line (PL) and bit-line (BL). Pass transistors of 1T1C memory cells 402 of every other columns on the same row, e.g. row 0 and col. 0, 2, ... N−1, are coupled to the same word-line (WL) and controlled by the same WL signal. Two adjacent BLs, e.g. BL<0> and BL<1> are coupled to Vref transistors 406 which are controlled by the Vref_enable signals. In one embodiment, Vref transistors control whether a reference signal (Vref) is coupled to BLs. Every BL is coupled on the other end to pre-charge transistor 408 which controls pre-charging of BLs (steps 150, 154). BLs are further coupled to column transistors 410 which control connection of BLs to sense amplifiers 412. In one embodiment, adjacent BLs, e.g. BL<0:1>, are coupled to two respective inputs of a single SA 412. All SAs 412 are controlled by SA_enable signals.

In one embodiment, F-RAM device 400 may be configured to operate as 1T1C memory array for single-ended sensing/read or 2T2C memory array for differential sensing/read. In the embodiment of 2T2C configuration, two adjacent 1T1C memory cells of the same row may be paired up to form a 2T2C memory cell 404. As previously explained, the two 1T1C memory cells of the complementary pair may be programmed to opposite polarization states during writing of data, and one of them represents the true signal/bit while the other the complementary signal/bit.

FIGS. 5A to 5F are representative timing diagrams illustrating signal level of various nodes during a read operation/sensing of an F-RAM array, such as F-RAM device 400. In one embodiment, precharge is the signal coupled to gates of pre-charge transistors 408. VREF_enable is the signal coupled to the gates of Vref transistors 406. In one embodiment, Vref transistors control the assertion of Vref to BLs. For example, VREF_enable<0> controls Vref transistors 406 connecting to odd BLs, such as BL<1>, BL<3>, etc., whereas VREF_enable<1> controls Vref transistors 406 connecting to even BLs, such as BL<0>, BL<2>, etc. WLs<odd numbers> control pass transistors in odd columns and WLs<even numbers> control pass transistors in even columns of the same row. Column_enable is the signal coupled to gates of column transistors 410 which control electrical connectivity between sense amplifiers 412 to each of its respective BLs.

Figure 5A:
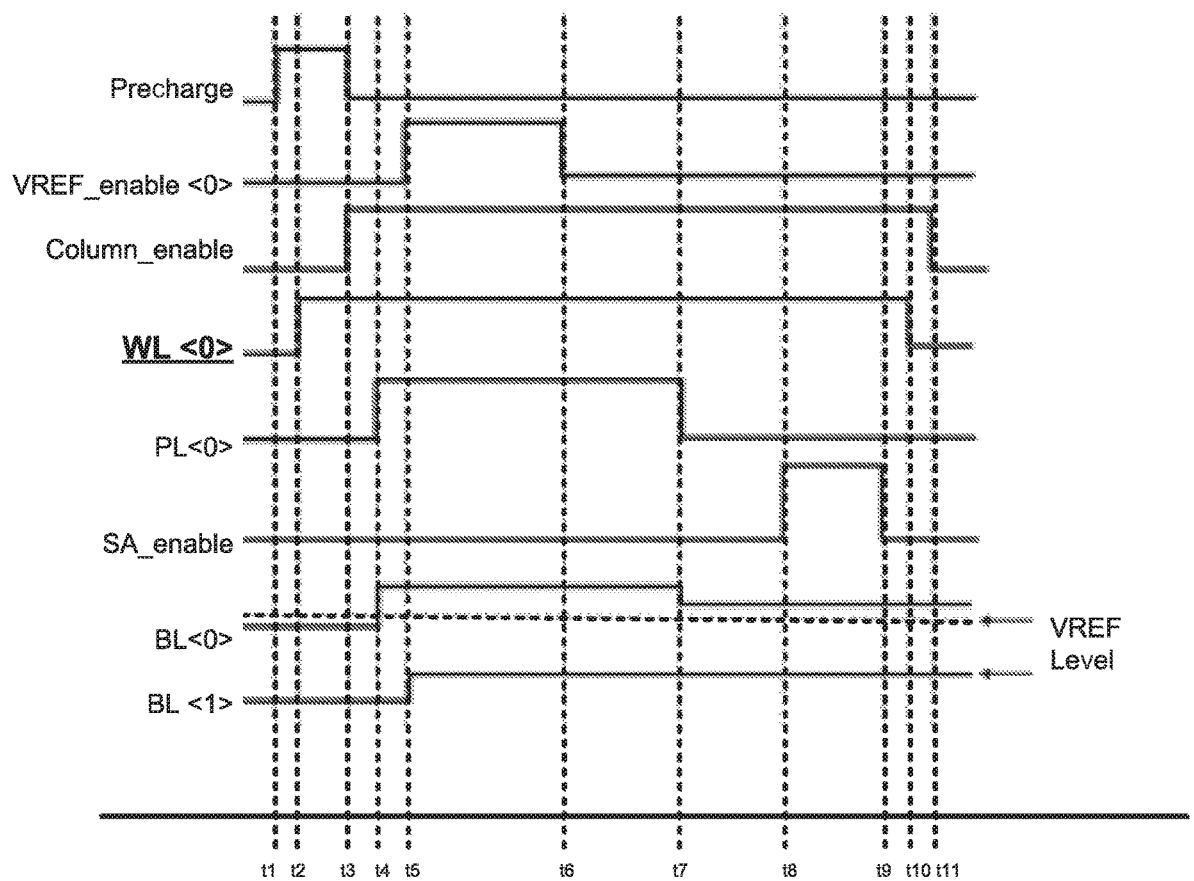
FIGS. 5A to 5F are representative timing diagrams illustrating signal levels of various nodes of an F-RAM device during a read operation (sensing scheme) in accordance with embodiments of the subject matter.

As illustrated in FIG. 1A, a read operation commences with selection of an F-RAM memory cell for sensing (step 150). Referring to FIG. 5A, F-RAM device 400 is configured to perform as an 1T1C F-RAM array and 1T1C memory cell 402 in row 0 and column 0 is selected for the read operation. At timing t1, precharge signal is asserted until t3 to enable pre-charge transistors of all column such that all BLs are pre-charged, for example to Vss. At t2, WL<0> signal is asserted (step 152) or brought high such that ferroelectric capacitor of column 0, row 0 is electrically connected to BL<0>. In one embodiment, WL<0> signal is asserted until the sensing is completed at t10. WL<N:1> signals may be all de-asserted or brought low during the sensing such that unselected 1T1C memory cells 402 in other rows and columns are not electrically connected to their respective BLs. Column_enable signal is asserted at t3 until t11 during the entire sensing to ensure electrical connection between sense amplifiers 412 and their respective BLs is maintained. In one embodiment, PL<0> signal is asserted between t4 and t7 to interrogate the selected 1T1C memory cell 402 (step 156). As illustrated in FIG. 5A, PL<0> signal may represent the previously mentioned "up-down" or square pulse, in which it may switch from Vss to $V_{DD}$ (at t4) and then from $V_{DD}$ to Vss (at t7). During t4 and t7, the ferroelectric capacitor in the selected 1T1C memory cell 402 may flip (P-term) or maintain (U-term) its polarization state due to the assertion of PL<0> signal on one of its plates. In response, the selected 1T1C memory cell 402 may output a corresponding memory signal that is reflected in BL<0> of FIG. 5A. Since it is a single-ended sensing, the output memory signal on BL<0> is to be compared to a reference signal (Vref) via BL<1> that is controlled by VREF_enable signals. As previously mentioned, Vref may be pre-set to a value between P-term and U-term of 1T1C memory cells 402, or other programmable values. In one embodiment, VREF_enable<0> signal is asserted at t5 such that Vref is applied on BL<1>. Since WLs<N:1> are all disabled, 1T1C memory cells 402 on column 1 are all electrically isolated from BL<1>. At t8, SA_enable signal is asserted such that all sense amplifiers 412 are enabled (step 158). BL<0> and BL<1> are respectively coupled to their respective inputs in sense amplifier 412. Sense amplifier 412 may then compare the signal (such as their respective amplitudes) on BL<0> (memory signal) to the signal on BL<1> (Vref), and output the result accordingly (step 160). As an example, the memory signal on BL<0> is greater than Vref, which signifies P-term (binary state "0" or "1"). It will be the understanding that the memory signal on BL<0> may also be less than Vref to signify U-term ("1" or "0"). After that, the read operation is completed, and WL<0> signal is de-asserted (brought low) at t10 and column_enable signal at t11, such that all 1T1C memory cells are again electrically isolated from all BLs.

Figure 5B:
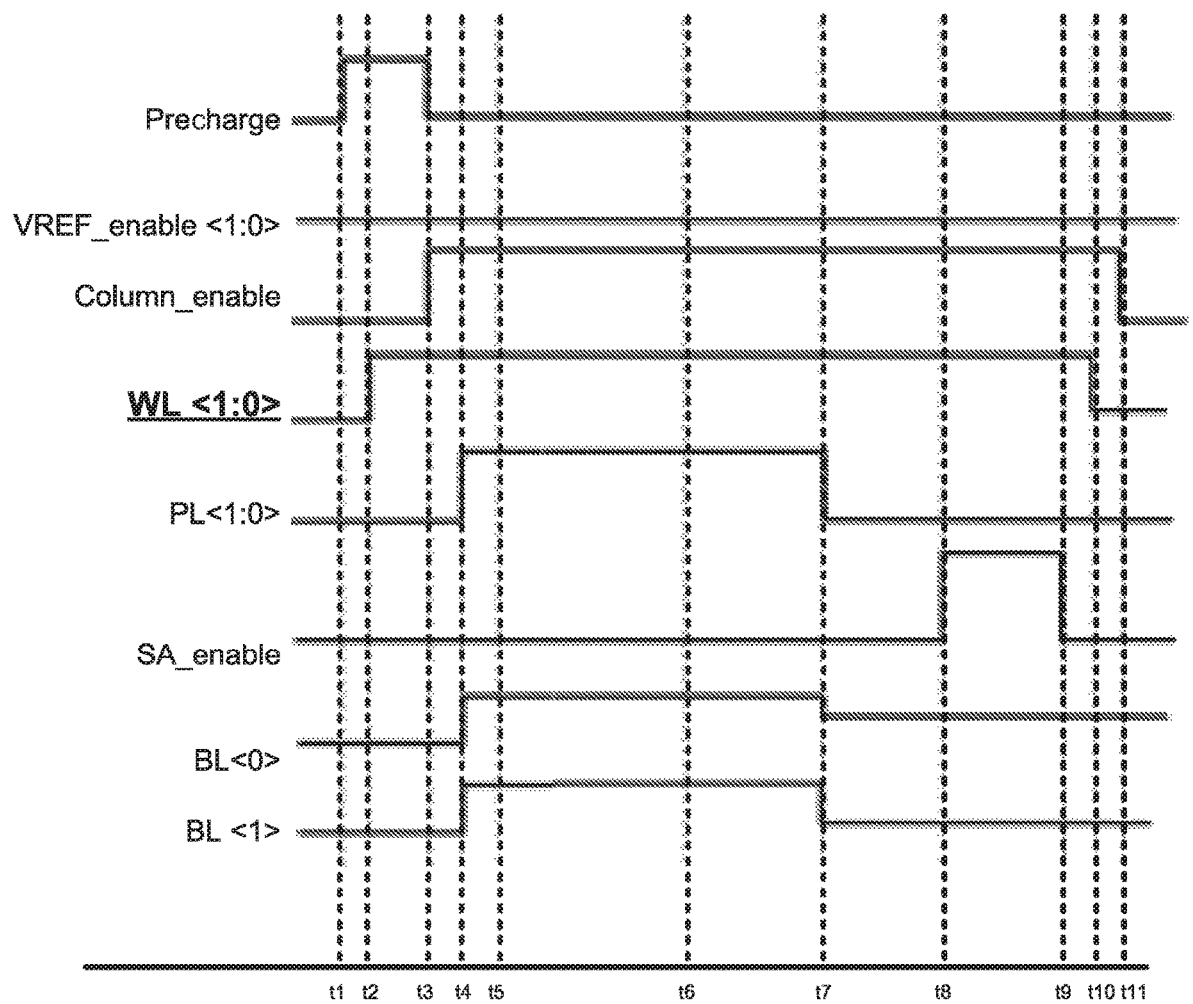

FIG. 5B is a representative timing diagram illustrating a read operation of F-RAM device 400 in a 2T2C differential sensing configuration. In one embodiment, 1T1C memory cells 402 in row 0, column 0 and 1, are paired to form a 2T2C memory cell 404, which is selected to be read. 1T1C memory cell 402 in row 0, column 0 is configured to be the true cell and 1T1C memory cell 402 in row 0, column 1 is configured to be the complementary cell. The operation of 2T2C sensing is similar to the embodiment illustrated in FIG. 5A except VREF_enable<1:0> are both disabled. Therefore, Vref is not applied on any BLs during the sensing operation. Instead, WL<1> signal is asserted at t2 with WL<0> signal, and PL<1> signal is asserted at t4 with PL<0> signal. As a result, both the true memory cell and the complementary cell are interrogated by the "up-down" pulse and output its content to BL<0> and BL<1> respectively. In one embodiment, when SA_enable is asserted on at t8 to enable sense amplifier 412, sense amplifier 412 having BL<1:0> signals as its two inputs may compare the true signal via BL<0> to the complementary signal via BL<1> to determine the binary state of the 2T2C memory cell 404.

As illustrated in both FIGS. 5A and 5B, WL of the selected memory cell (WL<0> in FIG. 5A and WL<1:0> in FIG. 5B) remains activated during sensing (t8 to t9). As previously explained, once the selected memory cell is interrogated by the "up-down" pulse (at t7), there is no need to maintain electrical connection between the selected memory cell to the sense amplifier. In fact, the connection may contribute to a significant amount of asymmetry to the sense amplifier, and adversely reduce the sensing margin (both 1T1C and 2T2C).

Figure 5C:
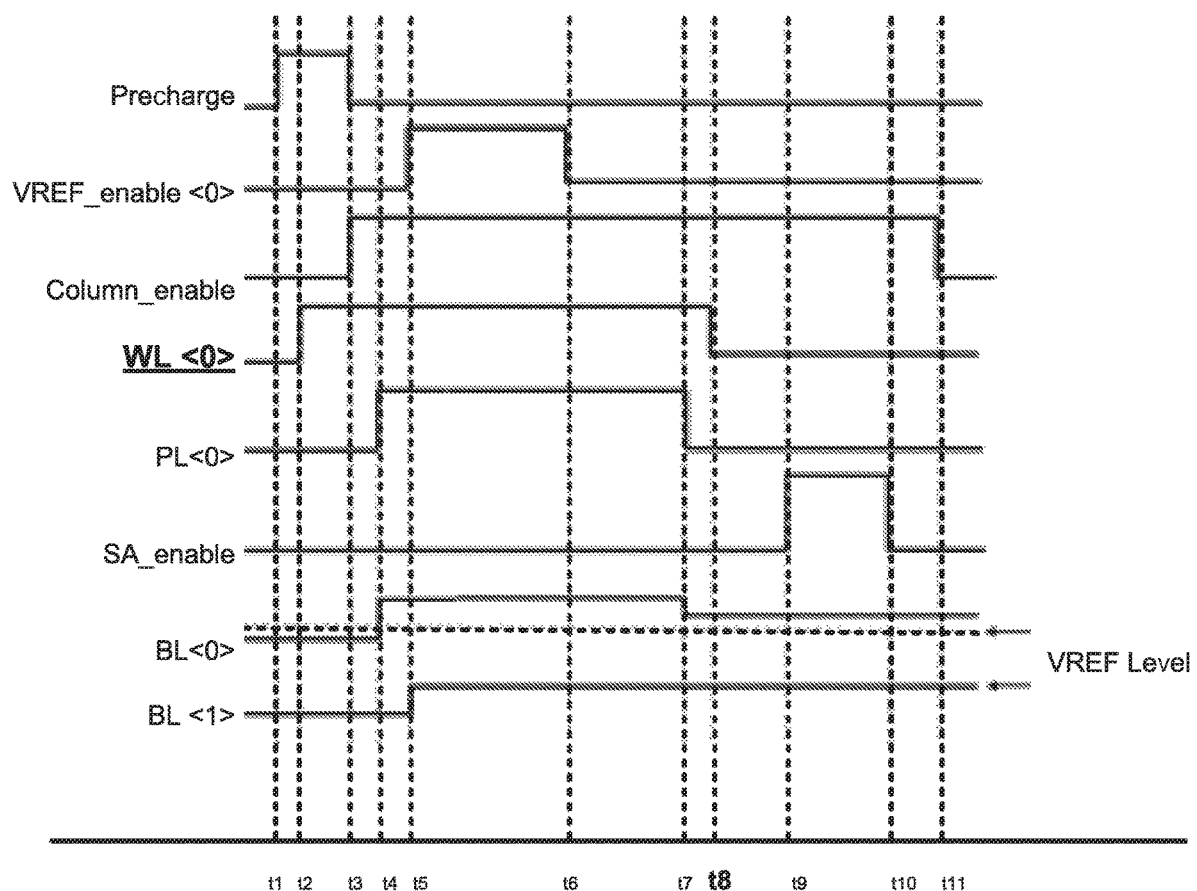
Figure 5D:
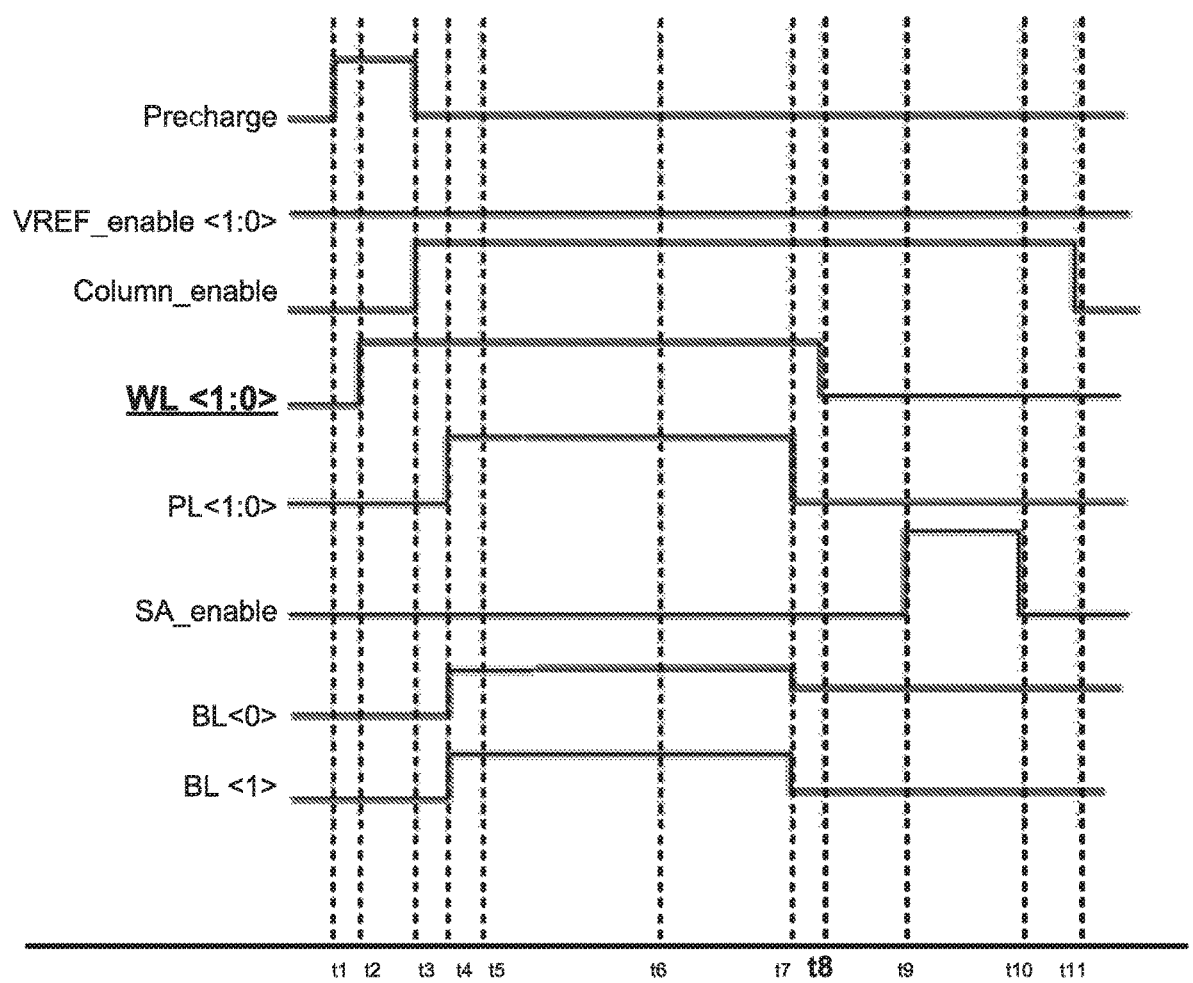

FIGS. 5C and 5D illustrate an alternative sensing scheme for F-RAM device 400. Referring to FIG. 5C, an 1T1C sensing operation is illustrated. Similar to the embodiment disclosed in FIG. 5A, WL<0> signal is asserted (WL<0> activated) at t2 to turn on the pass transistor and enable electrical connection between the selected 1T1C memory cell 402 to BL<0>. PL<0> signal is asserted between t4 and t7 to interrogate the selected memory cell. The main difference of this scheme is that WL<0> signal is de-asserted or brought low (WL<0> deactivated), a little while after PL<0> signal is de-asserted, at t8. In one embodiment, the small amount of time between t7 and t8 may act as a buffer to allow the selected memory cell 402 to completely output its content to BL<0> before the connection is disabled at t8. After the ferroelectric capacitor in the selected memory cell is electrically isolated from BL<0> and sense amplifier 412, the SA_enable signal is asserted to enable sense amplifier 412 and start the sensing at t9. Without the effects from the ferroelectric capacitor (as the pass transistor is turned off) of selected memory cell, sense amplifier 412 may attain optimal balance and symmetry during its sensing operation.

FIG. 5D illustrated the alternative sensing scheme in a 2T2C configuration. Similar to the embodiment disclosed in FIG. 5C, both WL<0> and WL<1> signals are both de-asserted at t8, before the sense amplifier is enabled at t9. The electrical isolation between both ferroelectric capacitors in the selected 2T2C memory cell 404 to their respective BLs during sensing (t9 to t10) may also improve the balance and symmetry of sense amplifier 412 during the differential sensing.

Figure 5E:
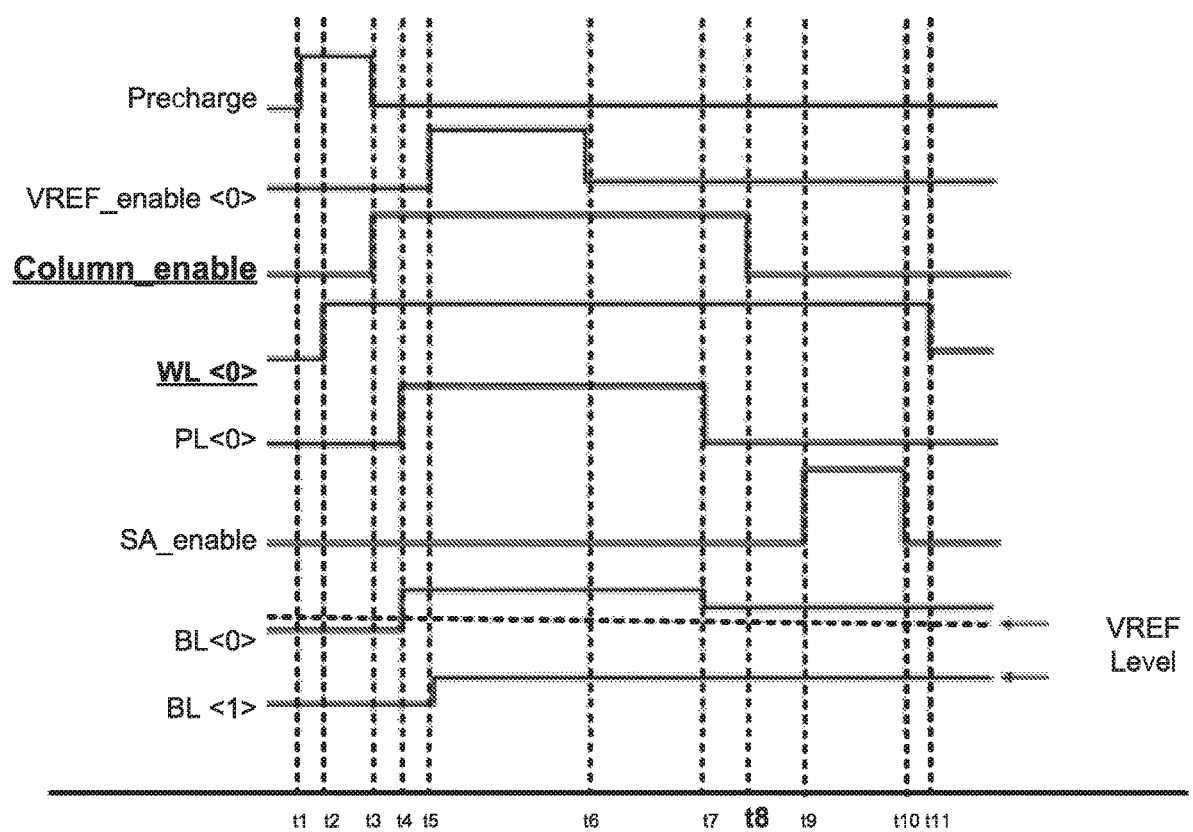
Figure 5F:
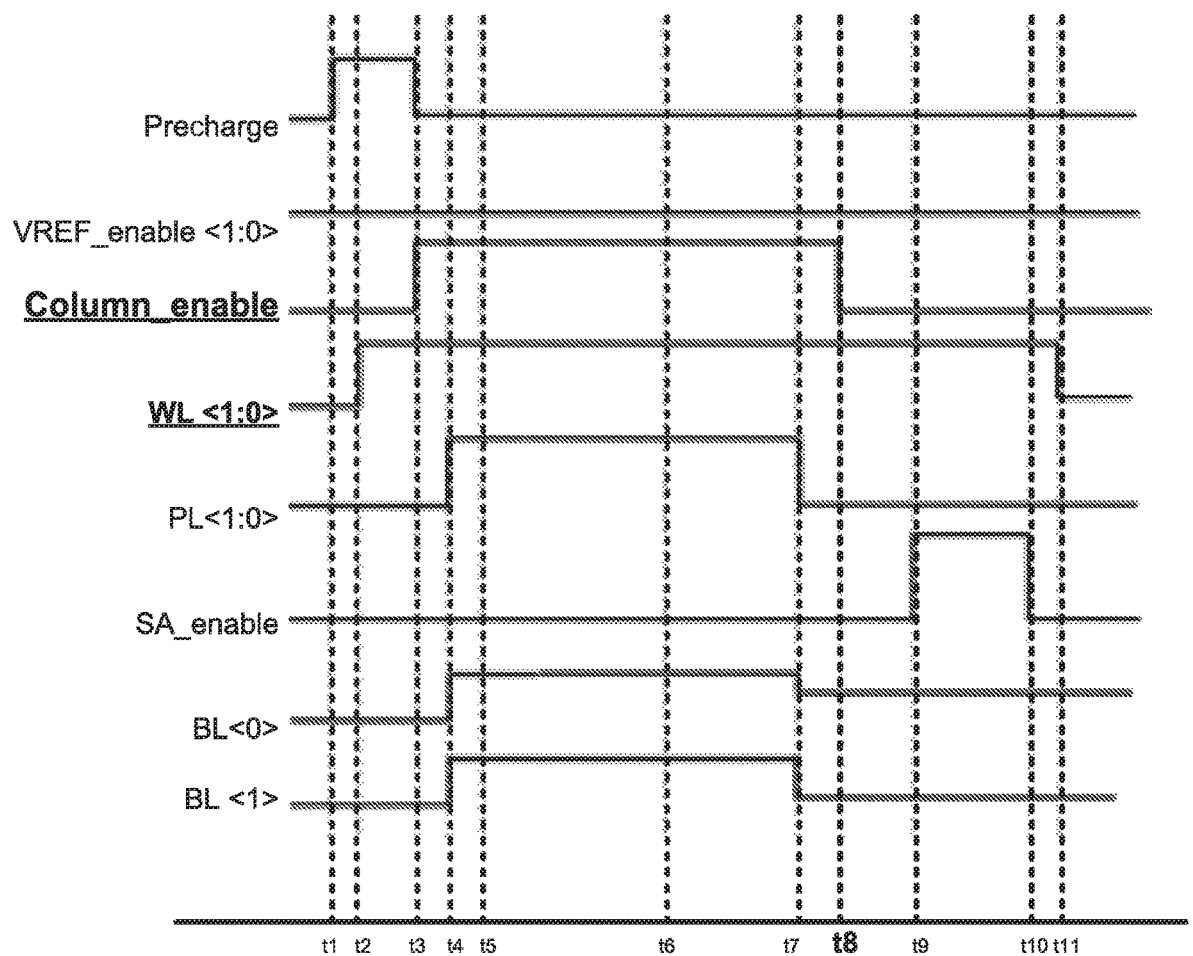

FIGS. 5E and 5F illustrate another alternative sensing scheme for F-RAM device 400. Referring to FIGS. 5C and 5D, the ferroelectric capacitors are isolated from the sense amplifiers 412 by de-asserting the WL signals before the sense amplifier is enabled. The WL signals control pass transistors that are local to each 1T1C memory cell 402. Similar to FIG. 5C, the 1T1C sensing scheme illustrated in FIG. 5E may also electrically disconnect the ferroelectric capacitor of the selected memory cell to the sense amplifier 412 globally during sensing. Referring to FIG. 5E, although WL<0> signal remains asserted during sensing (t9 to t10), column_enable signal is de-asserted or brought low a little bit after the "up-down" pulse on PL<0> is completed, at t8. The de-assertion of column_enable signal at t8 may electrically isolated BL<0> and ferroelectric capacitor from the sense amplifier 412. The buffer between t7 and t8 may enable memory signal to output to the input of sense amplifier 412 before its electrical connection to BL<0> is disabled at t8.

FIG. 5F illustrates the similar sensing scheme in a 2T2C configuration. In one embodiment, WL<1:0> signals are both kept asserted until t11. Symmetry and balance of sense amplifier still improves as sense amplifier is electrically isolated to both BL<1:0> when column_enable signal is de-asserted, at t8.

Another alternative to the sensing scheme may combine the embodiments disclosed in FIGS. 5C to 5F. In one embodiment, both WL signals (e.g. WL<1:0> signals) and column_enable signal are de-asserted right after PL signal ("up-down" pulse) is de-asserted, and before sense amplifier is enabled. This alternative scheme may ensure electrical isolation between sense amplifier and ferroelectric capacitor(s) both locally at individual memory cell level, and globally at BLs level.

In one embodiment, the disclosed sensing schemes may be applied to any memory technology where there is undesirable variation in memory cells that will have a direct effect on the sense amplifier and where the data can be extracted from the memory cells so that the sense amplifier can resolve the data after the memory cells have been isolated from sense amplifier inputs. For example, it may be applicable to M-RAM devices.

Figure 6:
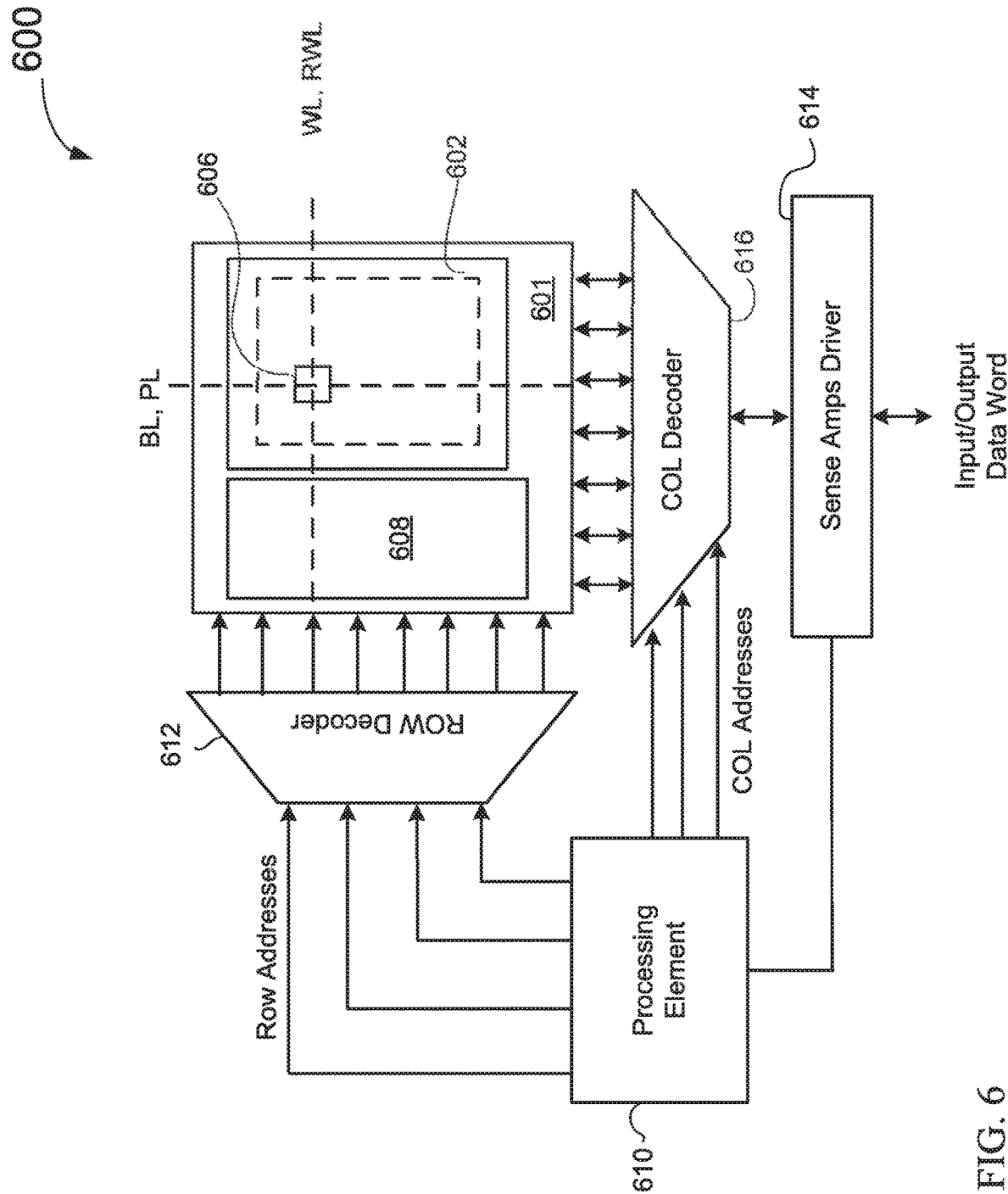
FIG. 6 is a schematic diagram illustrating a portion of a non-volatile memory system.

FIG. 6 is a representative block diagram of a semiconductor memory 600 including memory portion 601. Within memory portion 601, there is memory array 602 of non-volatile (NV) memory cells 606 arranged in a number of rows each sharing a common word-line (WL) and a number of columns each sharing a common bit-line and a common plate line. In one embodiment, NV memory cells 606 may be 1T1C F-RAM cells 100, or 2T2C F-RAM cells 200. In one embodiment, reference generating array 608, which includes MOS reference generating array and possibly ferroelectric reference generating array may also be disposed within memory portion 601. Referring to FIG. 6, semiconductor memory 600 further includes processing element 610, such as a micro-controller, micro-processor or state machine. In one embodiment, processing element 610 may issue commands or control signals, such as WL, RWL, signals to each of the NV memory cells 606 and reference generating array 608 to execute read, erase and program operations as described above, and other peripheral circuits for reading from or writing to the memory array 602. The peripheral circuits include row decoder 612 to convert and apply a memory address to the word-lines of NV memory cells 606 of the memory array 602. When a data word is read from the semiconductor memory 600, NV memory cells 606 coupled to a selected word-line (WL) are read out to bit-line, and a state of those lines is detected by sense amplifier/driver 614. The column decoder 616 outputs the data from the bit-line onto sense amplifier/driver 614. In one embodiment, processing element 610 may enable/disable sense amplifier for certain columns using sense amplifier enable signals. Processing element 610 may also, via row and/or column decoder 612 and 616, convert and apply an address to the memory array 602 to assert or de-assert word line signals to particular WLs. In one embodiment, semiconductor memory 600 may adopt the sensing scheme disclosed in FIGS. 5C to 5F, such that during a read operation, WL associated with the selected memory cell is disabled before the sense amplifier is enabled for sensing. The control may be achieved through firmware applications, circuit design (e.g. timing circuit), or a combination thereof.

Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the subject matter as set forth in the appended claims. The specification and drawings are, accordingly, to be regarded in an illustrative sense rather than a restrictive sense.

What is claimed is:

1. A memory device, comprising:
a plurality of memory cells arranged in rows and columns, wherein each memory cell includes a ferroelectric capacitor and a field-effect transistor (FET);
a first plate line coupling to a first ferroelectric capacitor of a first memory cell in a first column and a first row;
a first bit-line coupling a first FET of the first memory cell to a first sense amplifier; and
a first word-line coupling a word-line signal to the first FET;
wherein during a read operation of the first memory cell, a pulse signal is asserted on the first plate line to interrogate the first ferroelectric capacitor and is de-asserted before the sense amplifier is enabled for a sense operation, and wherein the word-line signal on the first word-line is de-asserted after the sense amplifier is disabled.

2. The memory device of claim 1, wherein the first FET is a pass transistor coupling a first plate of the first ferroelectric capacitor to the first bit-line and the first memory cell has a one-transistor-one-capacitor (1TIC) configuration.

3. The memory device of claim 2, wherein the first plate line is coupled to provide a pulse signal to a second plate of the first ferroelectric capacitor.

4. The memory device of claim 1, wherein the sense operation of the sense amplifier compares an amplitude of a memory signal outputted from the first memory cell through the first bit-line to a reference signal.

5. The memory device of claim 1, wherein the first word-line is coupled to a gate of the first FET and the word-line signal is configured to open or close the first FET.

6. The memory device of claim 4, further comprising:
a second plate line coupling to a second ferroelectric capacitor of the first memory cell in a second column and the first row; and
a second bit-line coupling a second FET of the first memory cell to the first sense amplifier;
wherein during the read operation of the first memory cell, a complementary signal outputted from the second memory cell through the second bit-line is coupled to the first sense amplifier as the reference signal.

7. A method of operation of a non-volatile memory device, comprising:
selecting a first memory cell of the non-volatile memory device for a read operation, wherein memory cells of the memory device are arranged in rows and columns, and wherein the first memory cell of the memory cells includes a one-transistor one-capacitor (1TIC) configuration;
coupling a word-line signal, through a first word-line, to open a first pass transistor of the first memory cell;
coupling a square pulse signal to a first ferroelectric capacitor of the first memory cell, through a first plate line, wherein a memory signal is outputted in response to an interrogation of the square pulse signal;
coupling the memory signal, through a first bit-line, to a sense amplifier; and
de-asserting the square pulse signal;
coupling an enable signal, after the square pulse signal is de-asserted, to the sense amplifier;
de-asserting the enable signal; and
de-asserting the word-line signal.

8. The method of claim 7, wherein the enable signal is configured to initiate a sense operation, and wherein the sense amplifier is configured to compare an amplitude of the memory signal to a reference signal to determine a binary state of the first memory cell.

9. The method of claim 7, wherein each of the memory cells includes a ferroelectric capacitor.

10. The method of claim 7, wherein the first word-line is associated with a first row of memory cells, and the first bit-line and the first plate line are associated with a first column of the memory cells.

11. The method of claim 7, wherein during the read operation, the word-line signal and the enable signal are not asserted at a same time.

12. A memory system, comprising:
a processing element;
a sense function; and
a ferroelectric memory array comprising memory cells, each memory cell including a ferroelectric capacitor and a field-effect transistor (FET), arranged in rows and columns and galvanically connected by bit-lines, plate lines, and word-lines, wherein a first plate line is coupled to a first ferroelectric capacitor of a first memory cell in a first column and a first row, a first bit-line couples a first FET of the first memory cell to the sense function, and a first word-line provides a word-line signal to the first FET; and wherein, during a read operation of the first memory cell a pulse signal is asserted on the first plate line to interrogate the first ferroelectric capacitor, the processing element is configured to enable a sense amplifier in the sense function to start a sense operation after the pulse signal is de-asserted, and wherein the word-line signal on the first word-line is de-asserted after the sense operation is complete.

13. The memory system of claim 12, further comprising a reference generating array, wherein the sense amplifier is configured to compare an amplitude of a memory signal outputted from the first memory cell through the first bit-line to a reference signal generated by the reference generating array.

14. The memory system of claim 12, wherein the first word-line is coupled to a gate of the first FET and the word-line signal is configured to open or close the first FET.

15. The memory system of claim 12, further comprising:
a row decoder; and
a column decoder.

16. The memory device of claim 1 further comprising a column transistor through which the first bit-line is coupled to the first sense amplifier, and wherein during the read operation of the first memory cell, a column enable signal to the column transistor is de-asserted before the sense amplifier is enabled.

17. The method of claim 7, wherein coupling the memory signal through the first bit-line to the sense amplifier comprises asserting a column enable signal to a column transistor through which the first bit-line is coupled to the sense amplifier, and further comprising de-asserting the column enable signal prior to coupling the enable signal to the sense amplifier.

18. The memory system of claim 12, further comprising a column transistor through which the first bit-line is coupled to the sense function, and wherein during the read operation of the first memory cell, a column enable signal to the column transistor is de-asserted before the sense amplifier is enabled.

* * * * *